United States Patent [19]
La et al.

[11] Patent Number: 6,136,510
[45] Date of Patent: *Oct. 24, 2000

[54] DOUBLED-SIDED WAFER SCRUBBING FOR IMPROVED PHOTOLITHOGRAPHY

[75] Inventors: Tho Le La, San Jose; Subramanian N. Venkatkrishnan; Mark T. Ramsbey, both of Sunnyvale; Jack F. Thomas, Palo Alto; Kathleen Regina Early, Santa Clara, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/800,940

[22] Filed: Feb. 13, 1997

[51] Int. Cl.$^7$ ........................................... G03F 7/00
[52] U.S. Cl. .............................. 430/313; 430/327; 134/1.3
[58] Field of Search ...................................... 430/311, 313, 430/314, 315, 317, 316, 318, 327; 134/1.2, 1.3

[56] References Cited

U.S. PATENT DOCUMENTS

| | | | |
|---|---|---|---|
| 3,911,562 | 10/1975 | Youmans | 29/590 |
| 4,944,836 | 7/1990 | Beyer et al. | 156/645 |
| 5,093,279 | 3/1992 | Andreshak et al. | 437/173 |
| 5,245,794 | 9/1993 | Salugsugan | 51/165.74 |
| 5,262,354 | 11/1993 | Cote et al. | 437/195 |
| 5,442,828 | 8/1995 | Lutz | 15/88.3 |
| 5,675,856 | 10/1997 | Itzkowitz | 15/77 |
| 5,711,818 | 1/1998 | Jain | 134/6 |
| 5,729,856 | 3/1998 | Jang | 15/88.1 |

OTHER PUBLICATIONS

Joshi, "A New Damascene Structure for Submicrometer Interconnect Wiring," IEEE Electron Letters, vol. 14, No. 3, Mar. 1993, pp. 129–132.

Kaanta et al., "Dual Damascene: A ULSI Wiring Technology," Jun. 11–12, 1991, VMIC Conference, IEEE, pp. 144–152.

Kenney et al., "A Buried–Plate Trench Cell for a 64–Mb DRAM," 1992 Symposium on VLSI Technology Digest of Technical Papers, IEEE, pp. 14–15.

Primary Examiner—Kathleen Duda

[57] ABSTRACT

The accuracy of photolithographic processing, particularly in forming small diameter through holes and/or trenches in a dielectric layer, is improved by double-sided scrubbing the wafer prior to photolithography. It was found that particles adhering to the wafer backside resulting from prior processing steps cause inaccurate photolithographic processing, particularly at a submicron level. Double-sided wafer scrubbing removes such adhering particles, thereby improving photolithographic accuracy.

19 Claims, 1 Drawing Sheet

DOUBLED-SIDED WAFER SCRUBBING FOR IMPROVED PHOTOLITHOGRAPHY

TECHNICAL FIELD

The present invention relates to a method of manufacturing a semiconductive device comprising submicron design features, such as transistors, contacts, vias and conductive lines. The present invention is particularly applicable for producing high speed integrated circuits.

BACKGROUND ART

Conventional semiconductor devices comprise a semiconductor wafer, normally monocrystalline silicon, and a plurality of sequentially formed dielectric layers and conductive layers on the wafer frontside, with integrated circuity containing a plurality of conductive patterns comprising spaced apart conductive lines, and a plurality of interconnect lines, such as bus lines, bit lines, word lines and logic interconnect lines. Typically, conductive patterns in different layers, i.e., upper and lower layers, are electrically connected by conductive vias; while electrical connection to an active region on the frontside of the wafer is effected by a contact hole filled with conductive material, such as a metal.

Conductive vias and contacts are typically formed by depositing a dielectric layer, forming an opening therethrough by conventional photolithographic techniques, and filling the opening with a conductive material, such as tungsten. One such method is known as damascene and basically involves the formation of an opening which is filled in with a metal, such as tungsten, to form an interconnecting contact or via plug. Damascene techniques are also conventionally employed to form conductive patterns of closely spaced apart conductive lines by employing photolithographic and etching techniques to form a plurality of trenches, for example, substantially horizontal trenches, in a dielectric layer, which trenches are subsequently filled with a metal. In copending application Ser. No. 08/320,516 filed on Oct. 11, 1994, prior art single and dual damascene techniques are disclosed, in addition to several improved dual damascene techniques for greater accuracy in forming fine line patterns with minimal interwiring spacings.

Conventional practices for forming vias and contacts by etching an opening through a dielectric layer and filling the opening with a metal involve complicated manipulative steps and are attendant with numerous disadvantages. Various problems stem from photolithographic techniques to form openings, etching and filling the openings, particularly in forming openings with submicron dimensions to satisfy increased densification requirements and performance in ultra-large scale integration semiconductor technology. Such problems lead to unreliable electrical contact, lower operating speeds and poor signal-to-noise ratios.

As the design requirements for interconnection patterns become more severe, requiring increasingly smaller dimensions for through holes, conductive line widths and interwiring spacings, such as less than about 0.30 $\mu$m, particularly less than about 0.25 $\mu$m, the ability of conventional photolithographic techniques to satisfy such demands with satisfactory accuracy becomes increasingly more difficult. The limitation on achieving such fine dimensions resides in the inability of conventional photolithographic techniques to satisfy the accuracy requirement for such fine patterns.

In forming patterns having a small dimension, such as about 0.30 to about 0.40 $\mu$m or greater, I-line photolithography is conventionally employed. As the maximum dimension is reduced, e.g., to below about 0.30 $\mu$m, such as less than about 0.25 $\mu$m, it is necessary to resort to shorter wavelengths, such as deep ultra-violet light. It is, however, very difficult to form fine line patterns with a maximum dimension of about 0.30 $\mu$m or less with any reasonable degree of accuracy, consistency and efficiency. Thus, there is a need for reducing photolithographic failure, particularly in printing contact holes and vias having a submicron dimension below about 0.30 $\mu$m, particularly below 0.25 $\mu$m.

DISCLOSURE OF THE INVENTION

An object of the present invention is a method of manufacturing a semiconductive device comprising transistors, contacts, vias and/or conductive lines with submicron dimensions.

Another object of the present invention is a method of manufacturing a semiconductive device having an a submicron interconnect structure with reduced photolithographic failure.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects were achieved in part by a method of manufacturing a semiconductive device, which method comprises: providing a wafer having a frontside and a backside; forming elements on the frontside of the wafer employing at least one photolithographic technique; and scrubbing the backside of the wafer prior to performing the photolithographic technique to remove particulate contaminants from the wafer backside, thereby improving the accuracy of the photolithographic technique.

A further aspect of the present invention is a method of manufacturing a semiconductive device, which method comprises sequentially: providing a wafer having a frontside and a backside; depositing a dielectric layer on the frontside of the wafer; double-sided scrubbing the wafer; and forming a photoresist mask on the dielectric layer.

Another aspect of the present invention is a method of manufacturing a semiconductor device, which method comprises sequentially: providing a wafer having a frontside and a backside; depositing a dielectric layer on the frontside of the wafer; double-sided scrubbing the wafer; forming a photoresist mask on the dielectric layer by a photolithographic technique; etching the underlying dielectric layer to form through holes and/or a plurality of substantially horizontally extending trenches therein; and filling the through holes and/or trenches with a conductive material.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
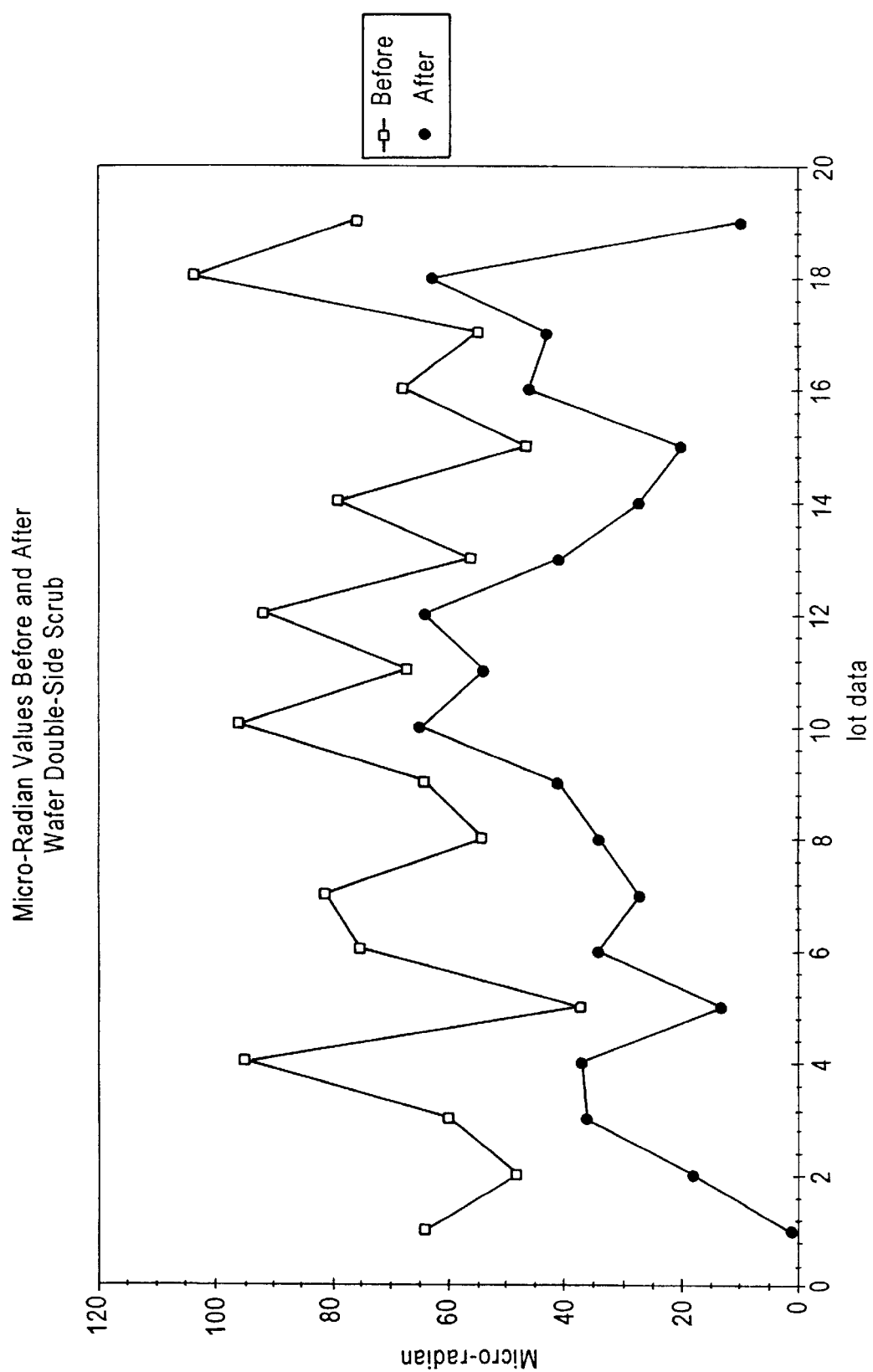
FIG. 1 is a plot of experimental data demonstrating the advantages of the present invention.

The present invention addresses the problem of photolithographic failure in printing through holes and trenches for forming contacts, vias and conductive lines having minimal dimensions, such as a maximum dimension less than about 0.30 microns, particularly less than about 0.25 microns. Upon extensive investigation of various photolithographic failures in printing through holes having minimal dimensions, it was found that the photolithographic stepper was employing tilts ranging from 40 to 100 microradians to compensate for measured wafer non-flatness. Such photolithographic failures typically include incomplete formation of a through hole and failure to form an opening at all resulting in a missing contact or via. Conventional photolithographic steppers tilt the exposure field to bring the entire exposure field within the stepper focal plane. However, while investigating photolithographic failures, it was found that for a 2×2 cm$^2$ field, the tilt numbers of 40 to 100 microradians correspond to 0.8 to 2.5 $\mu$m of z-height variation. These numbers are quite high compared with the stepper usable depth-of-focus, which is only about 0.6 microns for the involved masking levels. Such high tilt numbers strongly correlate with defective die locations.

Upon further extensive investigation and experimentation, it was found that micro-particles are unintentionally deposited on and/or adhered to the backside of a wafer during a previous processing step, believed to be result from transfer tools or processing equipment. Such wafer handling and, hence, backside exposure is extremely difficult to avoid during conventional semiconductor processing. It was further found that stepper induced tilting cannot compensate for such micro-defects, e.g., micro-bumps and hillocks on the wafer backside, because stepper induced tilting can only fit a flat plane.

The present invention stems from the discovery that contaminants, such as particulate material adhering to the backside of a conventional semiconductor wafer resulting from previous handling and/or processing steps, are largely responsible for photolithographic failure in printing minimal dimension through holes or conductive lines, e.g., less than about 0.30 $\mu$m, particular less than 0.25 $\mu$m. The present invention addresses and solves that problem in a cost-effective and efficient manner, preferably by utilizing existing production equipment. The solution to the photolithographic failure problem encompassed by the present invention resides in scrubbing the backside of the wafer, preferably by performing a double-sided scrubbing operation at strategic times during the manufacturing process, such as subsequent to deposition of a dielectric layer and/or immediately prior to photomasking, to improve wafer flatness by substantially removing backside micro-defects, such as micro-particles and hillocks.

In co-pending application Ser. No. 08/790,886, now U.S. Pat. No. 5,780,204, filed on Feb. 3, 1997 (Our Docket No. 1033-220), a method is disclosed for reducing photolithographic failures by chemical-mechanical planarization or polishing (CMP) a wafer backside, particularly subsequent to deposition of a dielectric layer and/or prior to photolithographic processing. The present invention comprises a less severe and more cost effective solution for reducing photolithographic failures by performing a double-sided scrubbing operation using conventional in place equipment to effect substantial removal of wafer backside micro-defects, such as micro-particles and hillocks. Thus, in accordance with the present invention, a significant reduction in photolithographic failure due to wafer backside micro-defects is realized.

In an embodiment of the present invention, backside scrubbing is effected by processing only the backside of the wafer by a scrubbing operation employing a brush, preferably made of a synthetic plastic, e.g., polyvinyl alcohol (PVA) in cylindrical shape, such as a brush of a conventional double-sided brushing apparatus. However, it was found more efficient to subject the wafer to a conventional double-sided brushing operation, using a conventional double-sided scrubbing apparatus, prior to forming a photomask. As double-sided scrubbing is a conventional technique, the details of conventional double-sided scrubbing techniques and apparatus are not set forth herein in detail. In employing a conventional double-sided scrubbing apparatus, wafers are sequentially passed through two brushing stations while the brushes are constantly flushed with dionized water to prevent particle build up. A conventional double-sided wafer scrubber is disclosed by Lutz, U.S. Pat. No. 5,442,828.

Conventional semiconductor manufacturing methodology comprises planarization by CMP, typically after metal deposition to fill openings and/or trenches in a dielectric layer, or after forming a metal pattern on the wafer frontside. Double-sided scrubbing is typically conducted subsequent to performing post metal deposition CMP, to remove contaminants generated during CMP. However, in accordance with the present invention, double-sided scrubbing is conducted preferably immediately prior to forming a photomask, to remove particulate contaminants from the backside of the wafer, thereby significantly improving the accuracy of the photolithographic technique employing the photomask. In accordance with the present invention, double-sided scrubbing is conducted prior to forming a photomask, preferably to obtain a wafer flatness, particularly a backside wafer flatness, wherein the maximum distance between a high and a low region within a stepper field, e.g., 2×2 cm$^2$, is no greater than the maximum feature size, i.e., line width or opening diameter, such as less than about 0.30 $\mu$m, e.g., less than 0.25 $\mu$m.

According to the present invention, methodology conventionally employed in fabricating a semiconductive device is conducted, including conventional deposition techniques, using conventional materials and employing conventional processing equipment. However, in accordance of the present invention, photolithographic failures are significantly reduced by strategically scrubbing the wafer backside, preferably by subjecting the wafer to a conventional double-sided scrubbing operation on a conventional double-sided scrubber, prior to forming a photomask on the wafer frontside. For example, in an embodiment of the present invention, a through hole is formed in a dielectric layer on the frontside of a semiconductor wafer, which through hole is then filled with conductive material, such as a metal, e.g., tungsten, to form a contact or plug electrically connected to an active region of the semiconductive wafer frontside, such as a source/drain region, or a conductive via electrically interconnecting conductive patterns on different levels of the semiconductor device.

This embodiment of the present invention comprises depositing a dielectric layer on the semiconductor wafer frontside, and then double-sided scrubbing the wafer, preferably immediately subsequent to depositing the dielectric layer and immediately prior to forming a photoresist mask on the dielectric layer. A photoresist mask, such as a contact photoresist mask, is then formed on the dielectric layer, preferably without performing any intervening processing step. For example, immediately after double-sided scrubbing the wafer, a layer of photoresist material is deposited on the dielectric layer and processed in accordance with a conventional photolithographic technique to form a contact photoresist mask. As a result of strategically conducted double-sided wafer scrubbing in accordance with the present invention, micro-defects, such as micro-particles and hillocks, on the backside surface of the semiconductive wafer are removed, thereby significantly reducing photolithographic failure, particularly in forming minimal dimension through holes and/or trenches, such as less than about 0.30 μm, e.g., less than about 0.25 μm.

In another embodiment of the present invention, double-sided wafer scrubbing is performed to reduce photolithographic failure in forming a conductive via between conductive patterns on different levels of a integrated semiconductor device. For example, after forming a contact plug in electrical contact with an active region on the wafer frontside, a conductive pattern is formed on a dielectric layer and a second dielectric layer is deposited on the conductive pattern. Double-sided wafer scrubbing is performed, preferably immediately subsequent to depositing the second dielectric layer and/or immediately before forming a photoresist mask on the second dielectric layer. The photoresist mask is typically formed by depositing a layer of photoresist material and performing any of various conventional photolithographic techniques. The second dielectric layer is then etched through the photoresist mask to form a through hole which is filled with a conductive material, such as a metal, e.g. tungsten, to form a conductive via in electrical contact with the underlying conductive pattern.

The present invention enjoys utility in forming conductive patterns comprising a plurality of closely spaced apart fine conductive lines by damascene techniques. In accordance with an embodiment of the present invention, a dielectric layer is deposited on the frontside of a semiconductor wafer and double-sided wafer scrubbing is performed, preferably immediately thereafter. A photoresist material is then deposited on the dielectric layer, preferably immediately after double-sided wafer scrubbing, and a photoresist mask is formed defining a conductive pattern comprising a plurality of closely spaced apart fine conductive lines, preferably substantially horizontal trenches, with or without openings for vias, i.e., a conventional single or dual damascene technique. The underlying dielectric layer is then etched through the photoresist mask to form a plurality of trenches, e.g., substantially horizontally extending trenches, which trenches are then filled with conductive material, such as metal, to form a conductive pattern comprising a plurality of closely spaced apart fine conductive lines having a maximum dimension, e.g., line width and/or interwiring spacing, less than about 0.30 μm, including less than about 0.25 μm.

Double-sided wafer scrubbing in accordance with the present invention, removes particulate contaminants from the wafer backside. In an embodiment of the present invention, double-sided wafer scrubbing is performed at various strategic times during the semiconductor device manufacturing process, particularly after depositing a dielectric layer on the wafer frontside and/or immediately prior to forming a photoresist mask on the deposited dielectric layer by photolithographic techniques. Thus, double-sided wafer scrubbing is preferably implemented immediately prior to photolithographic processing on the frontside, thereby significantly reducing photolithographic failure. In conducting double-sided scrubbing, it has been found suitable to obtain a wafer flatness wherein the maximum distance between a high and a low region within the stepper field employed in subsequent photolithography, e.g., 2×2 cm², is no greater than the maximum feature size, i.e., line width or opening diameter, such as less than about 0.30 μm, e.g., less than about 0.25 μm.

EXAMPLE

A plurality of silicon semiconductive wafers were processed employing identical processing steps, material and equipment, except that double-sided wafer scrubbing was performed on one group of wafers subsequent to depositing a dielectric layer on the wafer frontside and immediately before forming a photoresist mask on the dielectric layer, employing a conventional photolithographic technique. Double-sided scrubbing was performed using a conventional double-sided scrubbing apparatus, model DSS-200, obtained from Ontrack Systems, Inc. located in San Jose, Calif. The double-sided scrubbing apparatus was operated at brush speed of about 100 to about 120 rpm, with about 1% to about 3% by weight NH$_4$OH and a roller speed of about 50 to about 80 rpm. Through holes were then etched in the dielectric layer through the photoresist mask, which through holes had a diameter no greater than about 0.30 μm. The through holes were then filled with tungsten employing a conventional vapor deposition technique. All wafers were then subjected to testing by a method called Level-Control (LC) diagnostics on an ASML stepper, which provides measurements of tilt in terms of micro-radian values. The results are set forth in Table I below and plotted in FIG. 1.

TABLE I

TABLE I

| ASM LCD (micro-radian values) for wafer double-side scrub | | |
|---|---|---|
| Before | After | % difference (improvement) |
| 64 | 1 | 98.4 |
| 48 | 18 | 62.5 |
| 60 | 36 | 40.0 |
| 95 | 37 | 61.1 |
| 37 | 13 | 64.9 |
| 75 | 34 | 54.7 |
| 81 | 27 | 66.7 |
| 54 | 34 | 37.0 |
| 64 | 41 | 35.9 |
| 96 | 65 | 32.3 |
| 67 | 54 | 19.4 |
| 92 | 64 | 30.4 |
| 56 | 41 | 26.8 |
| 79 | 27 | 65.8 |
| 46 | 20 | 56.5 |
| 68 | 46 | 32.4 |
| 55 | 43 | 21.8 |
| 104 | 63 | 39.4 |
| 76 | 10 | 86.8 |

It is apparent that the strategic performance of a double-sided scrubbing step in accordance with the present invention significantly reduced the compensatory stepper tilt numbers Rx and Ry on an average of about 50%. Such a significant reduction to in stepper tilt numbers translates to a commensurate reduction in photolithographic failures, thereby significantly reducing manufacturing costs and increasing device reliability.

The present invention can be practiced employing otherwise conventional double-sided scrubbing techniques and apparatus. For example, the double-sided scrubbing apparatus disclosed in the previously mentioned Lutz patent can be employed for double-sided wafer scrubbing in practicing the present invention on various wafers, particularly silicon wafers. The dielectric and conductive materials employed in the present invention are those conventionally employed in manufacturing semiconductor devices. For example, the dielectric materials include oxides, such as silicon oxide, and nitrides, such as silicon nitrides, as well as silicon oxynitrides. The dielectric layers of the present invention also include conventional dielectric layers, such as oxide layers, e.g., layers of silicon oxide, formed in a conventional manner, as by depositing tetraethyl orthosilicate (TEOS), thermolosilicidation of a deposited silicon layer, PECVD, thermo enhanced CVD and spin on techniques.

Conductive materials generally include doped polysilicon, aluminum, aluminum alloys, copper, copper alloys, and refractory metals, such as tungsten, titanium, and compounds and alloys thereof. In forming interconnects, conventional barrier layers and anti-reflective coatings can also be employed.

The dielectric layers and metal layers utilized in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed. Normally, when high melting point metals are deposited, CVD techniques are employed. Low melting point metals, such as aluminum and aluminum-based alloys, including aluminum-copper alloys, can be deposited by melting, reflow or sputtering. Polycrystalline silicon can also be employed as a conductive material in an interconnection pattern.

Various embodiments of the present invention comprise forming openings in a dielectric layer employing conventional photolithographic techniques, including forming and using a conventional photoresist mask, etch recipes, and etching techniques as, for example, plasma or reactive ion etching.

The present invention provides an efficient, cost-effective manufacturing technique which significantly reduces photolithographic failure in forming minimal dimension contacts/vias and conductive patterns, particularly those having a maximum dimension less than about 0.30 $\mu$m, e.g., less than about 0.25 $\mu$m. The present invention provides methodology yielding semiconductive devices having increased operating speeds with improved reliability, precision, accuracy, efficiency, wear characteristics and signal-to-noise ratios.

Only the preferred embodiments of the invention and but a few examples of its versatility are shown and described in the present disclosure. It is to be understood that the invention is capable of use in various other combinations and environments and is capable of changes or modifications within the scope of the inventive concept as disclosed herein.

What is claimed is:

1. A method of manufacturing a semiconductor device, which method comprises:
   providing a wafer having a frontside and a backside;
   sequentially forming a plurality of dielectric layers on the frontside of the wafer;
   performing a photolithographic technique on each dielectric layer on the frontside of the wafer to form an opening; and
   double-sided scrubbing the wafer after forming each dielectric layer and before performing the photolithographic technique to remove particulate contaminants from the wafer backside, thereby improving the accuracy of the photolithographic techniques.

2. The method according to claim 1, comprising conducting the double-sided scrubbing the wafer to remove backside particulates, thereby achieving a wafer flatness wherein the maximum distance between a high and low region within a stepper field used during the photolithographic technique is no greater than the maximum feature size within the stepper field.

3. A method of manufacturing a semiconductor device, which method comprises sequentially:
   providing a wafer having a frontside and a backside;
   depositing at least one dielectric layer on the frontside of the wafer;
   double-sided scrubbing the wafer after depositing the dielectric layer;
   forming a photomask on the dielectric layer; and
   performing at least one photolithographic technique to form an opening, wherein double-sided scrubbing removes particulate contaminants from the wafer backside, thereby improving the accuracy of the photolithographic technique.

4. The method according to claim 3, comprising etching the dielectric layer through the photomask to form at least one opening in the dielectric layer.

5. The method according to claim 4,
   wherein the opening is a contact hole exposing an active region on the frontside of the wafer; and
   filling the contact hole with conductive material.

6. The method according to claim 5, further comprising forming a conductive pattern on the dielectric layer after etching.

7. The method according to claim 6, further comprising sequentially:
   depositing a second dielectric layer on the conductive pattern;
   double-sided scrubbing the wafer;
   depositing a photoresist layer on the second dielectric layer;
   forming a photoresist mask by a photolithographic technique;
   etching the second dielectric layer to form at least one opening therein.

8. The method according to claim 7, wherein the opening in the second dielectric layer is a through hole, the method further comprising:
   filling the through hole with conductive material to form a conductive via in electrical contact with the underlying conductive pattern.

9. The method according to claim 8, wherein the through hole has a diameter less than about 0.30 $\mu$m.

10. The method according to claim 7, comprising conducting the double-sided scrubbing the wafer, after depositing the second dielectric layer, to a wafer flatness wherein the maximum distance between a high and low region within a stepper field used during the photolithographic technique is no greater than the maximum feature size within the stepper field.

11. The method according to claim 5, wherein the contact hole has a diameter less than about 0.30 μm.

12. The method according to claim 4, comprising etching the dielectric layer to form a plurality of trenches extending in a substantially horizontal direction; and filling the trenches with conductive material to form a plurality of conductive lines of a conductive pattern separated by an interwiring spacing.

13. The method according to claim 12, wherein the conductive material is a metal.

14. The method according to claim 12, wherein the width of the conductive lines is less than about 0.30 microns.

15. The method according to claim 4, comprising sequentially:

double-sided scrubbing the wafer after depositing the dielectric layer on the frontside of the wafer;

depositing a photoresist material on the dielectric layer after double-sided scrubbing;

forming the photomask by a photolithographic technique; and etching the underlying dielectric layer through the photoresist mask to form at least one opening having a sub-micron dimension.

16. The method according to claim 15, comprising conducting the double-sided scrubbing the wafer to a wafer flatness wherein the maximum distance between a high and low region within a stepper field used during the photolithographic technique is no greater than the maximum feature size within the stepper field.

17. The method according to claim 3, comprising sequentially:

depositing a metal layer on the dielectric layer;

double-sided scrubbing the wafer;

depositing a layer of photoresist material on the metal layer;

forming a photoresist mask by a photolithographic technique; and etching the underlying metal layer to form a conductive pattern comprising the plurality of conductive lines with an interwiring spacing therebetween.

18. The method according to claim 17, comprising conducting the double-sided scrubbing the wafer to a backside wafer flatness wherein the maximum distance between a high and low region within a stepper field used during the photolithographic technique is no greater than the maximum feature size within the stepper field.

19. The method according to claim 3, comprising conducting the double-sided scrubbing the wafer to remove backside particulates, thereby achieving a wafer flatness wherein the maximum distance between a high and low region within a stepper field used during the photolithographic technique is no greater than the maximum feature size within the stepper field.

* * * * *